United States Patent
Hsu et al.

(10) Patent No.: US 6,815,987 B2
(45) Date of Patent: Nov. 9, 2004

(54) PHASE LOCKED LOOP

(75) Inventors: Tse-Hsiang Hsu, Hsinchu (TW); Chih-Cheng Chen, Hsinchu (TW)

(73) Assignee: Mediatek Inc., Hsin-chu (TW)

( * ) Notice: Subject to any disclaimer, the term of this patent is extended or adjusted under 35 U.S.C. 154(b) by 9 days.

(21) Appl. No.: 10/279,102

(22) Filed: Oct. 24, 2002

(65) Prior Publication Data

US 2003/0131155 A1 Jul. 10, 2003

(30) Foreign Application Priority Data

Oct. 24, 2001 (TW) .......................................... 90126329 A

(51) Int. Cl.$^7$ ................................................. H03L 7/06
(52) U.S. Cl. ....................................... 327/156; 327/147
(58) Field of Search ................................ 327/147, 148, 327/150, 155, 156, 162; 331/17, 25; 375/373, 374, 375, 376

(56) References Cited

U.S. PATENT DOCUMENTS 6,259,755 B1 * 7/2001 O'Sullivan et al. ......... 375/376
6,584,163 B1 * 6/2003 Myers et al. ............... 375/360

* cited by examiner

Primary Examiner—Linh M. Nguyen
(74) Attorney, Agent, or Firm—Birch, Stewart, Kolasch & Birch, LLP

(57) ABSTRACT

A phase locked loop (PLL), which has high operation speed and high resolution, and is particularly applicable in high frequency process, is disclosed. The PLL, receiving a data signal and generating a clock signal, comprises a voltage controlled oscillator (VCO) and multi-phase generator (MPG), a transition detector, an optimal phase encoder, and a phase selector, wherein the four devices are respectively used for outputting N phase clock signals of same frequency but different phases, for outputting a data period value and a clock period value by receiving the N phase clock signals, the data signal and the clock signal, for outputting a phase select signal according to the data period value and the clock period value, and for outputting one of the phase clock signals according to the phase select signal.

10 Claims, 6 Drawing Sheets

PHASE LOCKED LOOP

This application incorporates by reference of Taiwan application Serial No. 090126329, filed on Oct. 24, 2001.

BACKGROUND OF THE INVENTION

1. Field of the Invention

The invention relates in general to a phase locked loop, and more particularly to phase locked loop with high operating speed.

2. Description of the Related Art

Phase locked loop (PLL) is a circuit for controlling the frequency and the phase of its output signal according to a criterion. Nowadays, it has been wildly used in the wireless communications. For example, the PLL is used to provide the clock signal in the decoding process after the receiver receives a data signal. The frequency and the phase of the clock signal play an important role of success decoding of the data signal. If the initial phase error between the data signal and the clock signal is too large, it will cost about several microseconds to be in the phase locked state. Only when the phase error between the data signal and the clock signal decreases rapidly, can the decoding of the data signal succeed efficiently. To speed the PLL to go to the phase locked state, the phase of the clock signal can be first adjusted to decrease the phase error between the data signal and the clock signal by applying a voltage controlled oscillator (VCO) and a multi-phase generator (MPG).

FIG. 1 illustrates the block diagram of a PLL 100 according to a traditional method, wherein the PLL 100 is used to receive the data signal DATA. After the data signal DATA passes through the inverter 102(1) and inverter 102(2), a data signal DATAX is produced. Then, the phase detector 104 receives the data signal DATAX and a clock signal CLKX, and outputs a rising signal UP and a descending signal DN to a charge pump 106 according to the phase error between the data signal DATAX and the clock signal CLKX. The charge pump 106 outputs a charge current Icp to a loop filter 108 according to the pulse width between the rising signal UP and the descending signal DN. The loop filter 108 filters out the high frequency part of the charge current Icp and outputs a voltage V.

The VCO and MPG 110 receives the voltage V and then outputs some phase clock signals, for example six phase clock signal: P0~P5. They have same frequency, which corresponds to the voltages V, but are regularly out of phase. The phase clock signal P1 lags the phase clock signal P0 by a phase delay of 60 degree, being 360/6, and the phase clock signal P2 also lags the phase clock signal P1 by a phase delay of 60 degree, and so on.

All the phase clock signals P0~P5 are inputted to a phase selector 112, and one of the phase clock signals P0~P5 is selected as the basic clock signal PCLK and is outputted from the phase selector 112 according to the selecting signal PSEL. Then, the basic clock signal PCLK is inputted to a logic circuit unit 114 and a clock signal CLK is outputted there from, wherein the logic circuit unit 114 can be a divider or other logic circuit capable of processing the basic clock signal PCLK. Afterwards, the clock signal CLK is processed orderly by two inverters 103(1), 103(2), and the clock signal CLKX is produced from the inverter 103(2). The clock signal CLKX has a delay time Td to the phase clock signal P0~P5, wherein the delay time Td comprises the delay time of the phase selector 112, logic circuit unit 114, and two inverters 103(1), 103(2).

Therefore, the phase clock signals P0~P5 with the most proper phase is selected as the basic clock signal PCLK by comparing the data signal DATAX with the phase clock signals P0~P5 having a dummy delay Td. As shown in FIG. 1, the phase clock signal P0~P5 are respectively inputted into a first delay units 120(0)~120(5), a second delay units 122(0)~122(5), the inverters 124(0)~124(5), and the inverters 125(0)~125(5). The delay time of the first delay unit 120 and the second delay unit 122 are respectively the same with that of the phase selector 112 and the logic circuit 114. The total delay time of the first delay units 120, the second delay units 122, the inverters 124, and the inverters 125 is the dummy delay Td. Thus, the dummy-delay phase clock signal PX0~PX5, being the phase clock signals P0~P5 having the dummy delay Td, are obtained.

After the dummy-delay phase clock signal PX0~PX5 are produced, they are inputted into a transition detector 118, as well as the data signal DATAX. The transition detector 118 detects the dummy-delay phase clock signal PX0~PX5 with the closest phase, compared with the data signal DATAX, and then outputs a corresponding clock period value CLKP. An optimal phase encoder 116 receives the clock period value CLKP and outputs a phase select signal PSEL to the phase selector 112. Finally, according to the clock period value CLKP, the phase selector 112 selects the most proper phase clock signal P0~P5 so as to make the clock signal CLKX have the closest phase with data signal DATAX. Therefore, the rapid phase locked is achieved by properly choosing the phase clock signal P0~P5.

However, each of the first delay units 120(0)~120(5) usually has different delay time, as well as the second delay units 122(0)~122(5), the inverters 124(0)~124(5), and the inverters 125(0)~125(5), which is resulted from the process variation of fabrication manufacturing and the lines difference of layout. Therefore, the dummy-delay phase clock signals PX0~PX5 are different in phase spacing. For example, when the delay time of the dummy-delay phase clock signal PX0 to the phase clock signal P0 is larger than that of the dummy-delay phase clock signal PX1 to the phase clock signal P1, the phase spacing between the dummy-delay phase clock signal PX0 and dummy-delay phase clock signal PX1 is larger than 60 degree. Thus, other phase spacings among the dummy-delay phase clock signal PX0~PX5 will be unequal, too. Upon the same delay time, a larger phase error and more apparent phenomenon of the unequal phase spacing will be particularly produced as the high-frequency signal is processed, compared with the low-frequency signal. Hence, the operation speed and the resolution of the PLL will be lowered largely.

SUMMARY OF THE INVENTION

It is therefore an object of the invention to provide a phase locked loop (PLL) with high operating speed and high resolution, particularly in the processing of high frequency.

The PLL, receiving a data signal and generating a clock signal, comprises a phase detector, a loop filter, a voltage controlled oscillator (VCO) and multi-phase generator (MPG), a transition detector, an optimal phase encoder, and a phase selector is disclosed. The phase detector is used for receiving the data signal and the clock signal, and for outputting a phase difference signal according to the phase difference between the data signal and the clock signal. The loop filter is used for outputting a voltage according to the phase difference signal. The voltage controlled oscillator (VCO) and multi-phase generator (MPG) is used for outputting N phase clock signals, wherein (i+1)th phase clock signal lags ith phase clock signal by a phase delay, and all of the N phase clock signals have same frequency corresponding to the voltage. The N and the i are integers and have a relationship of $0 \leq i < N-1$. The transition detector is used for outputting a data period value and a clock period value by receiving the N phase clock signals, the data signal and the clock signal, wherein the period between the level transition of ith phase clock signal and that of (i+1)th phase clock signal is defined as ith transition region, and the data period value and the clock period value are respectively the numbers of the transition regions in which the level transitions of the data signal and the clock signal occur. The optimal phase encoder is used for outputting a phase select signal according to the data period value and the clock period value, wherein the phase select signal corresponds to the difference between the clock period value and the data period value. The phase selector is used for outputting a jth phase clock signal according to the phase select signal, wherein the jth phase clock signal corresponds to the clock signal, and the j is an integer and obeys a relationship of $0 \leq j < N-1$.

Alternatively, the PLL, receiving a data signal and generating a clock signal, can also comprise a phase detector, a loop filter, a VCO and MPG, an optimal phase determination unit, and a phase selector. The phase detector is used for receiving the data signal and the clock signal, and for outputting a phase difference signal according to the phase difference between the data signal and the clock signal. The loop filter is used for outputting a voltage according to the phase difference signal. The voltage VCO and MPG is used for outputting N phase clock signals, wherein (i+1)th phase clock signal lags ith phase clock signal by phase delay, and all of the N phase clock signals have same frequency corresponding to the voltage. The N and the i are integers and have a relationship of $0 \leq i-1$. The optimal phase determination unit is used for outputting a phase select signal by receiving the N phase clock signals, the data signal, and the clock signal, wherein the phase difference between the data signal and the clock signal corresponds to m transition regions, said m is an integer and obeys the relation $0 \leq m < N$. The phase selector is used for outputting a jth phase clock signal according to the phase select signal, wherein the jth phase clock signal corresponds to the clock signal, and the j is an integer and obeys a relationship of $0 \leq j < N-1$.

BRIEF DESCRIPTION OF THE DRAWINGS

Other objects, features, and advantages of the invention will become apparent from the following detailed description of the preferred but non-limiting embodiments. The description is made with reference to the accompanying drawings.

DESCRIPTION OF THE PREFERRED EMBODIMENT

By respectively comparing the clock signal CLKX and the data signal DATAX with the phase clock signals P0~P5 initially, the present invention rapidly achieves the phase locked state with high resolution.

Figure 2:
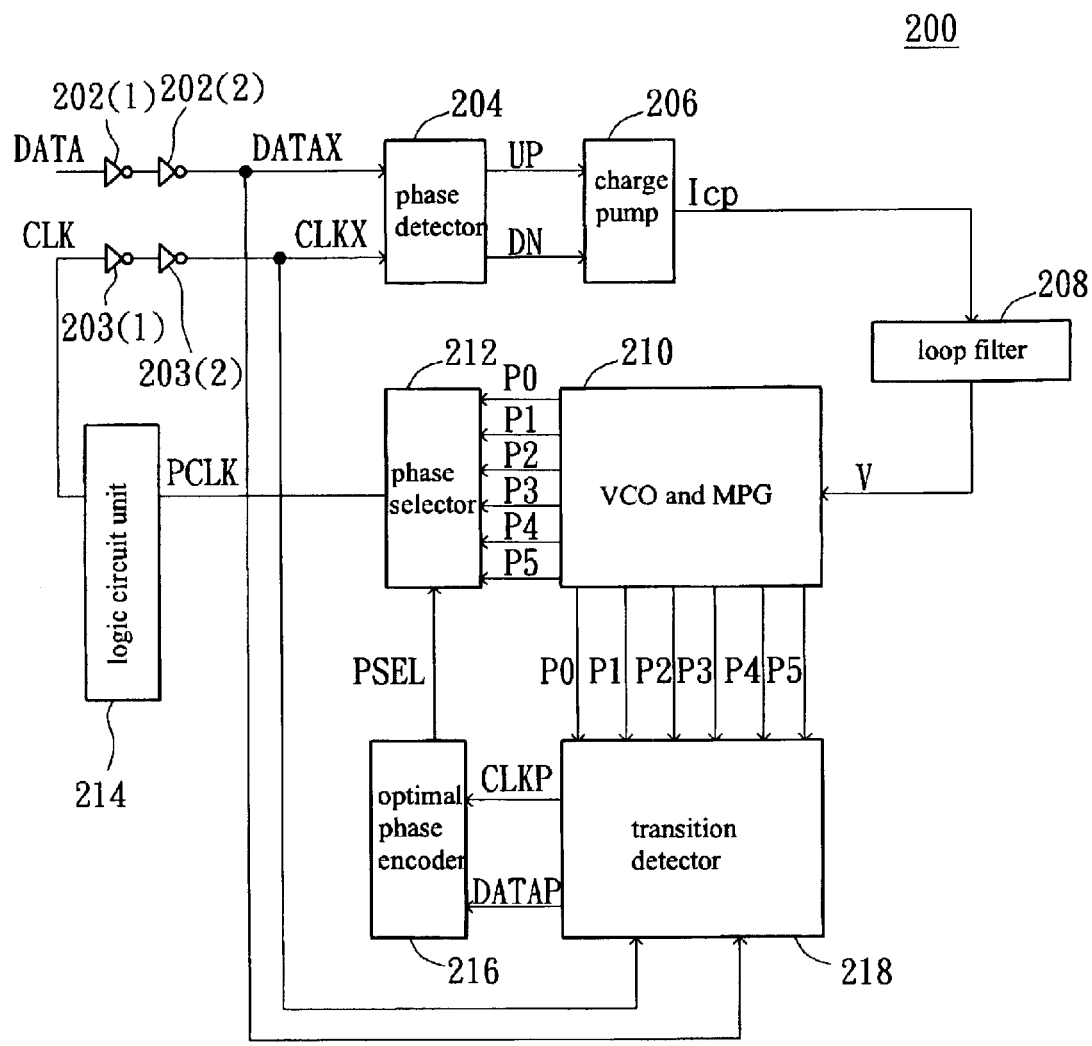
FIG. 2 illustrates the block diagram of a PLL according to the first embodiment of the present invention.

FIG. 2 illustrates the block diagram of a phase locked loop (PLL) according to the first embodiment of the present invention. The PLL 200 is used to receive a data signal DATA and to produce a clock signal CLK. The data signal DATA first passes through the inverter 202(1) and inverter 202(2), and then a data signal DATAX is outputted. A phase detector 204 receives the data signal DATAX and a clock signal CLKX, and outputs a rising signal UP and a descending signal DN to a charge pump 206 according to the phase error between the data signal DATAX and the clock signal CLKX. The charge pump 206 outputs a charge current Icp to a loop filter 208 according to the pulse width between the rising signal UP and the descending signal DN. The loop filter 208 filters out the high frequency part of the charge current Icp and outputs a voltage V.

A voltage controlled oscillator (VCO) and a multi-phase generator (MPG) 210 receives the voltage V and then outputs some phase clock signals, for example six phase clock signal: P0~P5. They have same frequency, which corresponds to the voltages V, but are out of phase. The phase clock signal P1 has a phase delay of 60 degree, being 360/6 degree, to the phase clock signal P0, the phase clock signal P2 also has a phase delay of 60 degree to the phase clock signal P1, and so on. Each of the phase clock signals P0~P5 respectively corresponds to a phase numeral CURP, for instance being 0~5. The phase numeral CURP is one of the inputs for the adder 404 in FIG. 4.

All the phase clock signals P0~P5 are inputted to a phase selector 212, and one of the phase clock signals P0~P5 is selected as the basic clock signal PCLK and is outputted from the phase selector 212 according to the selecting signal PSEL. Then, the basic clock signal PCLK is inputted to a logic circuit unit 214 and a clock signal CLK having lower frequency is outputted there from.

Figure 1:
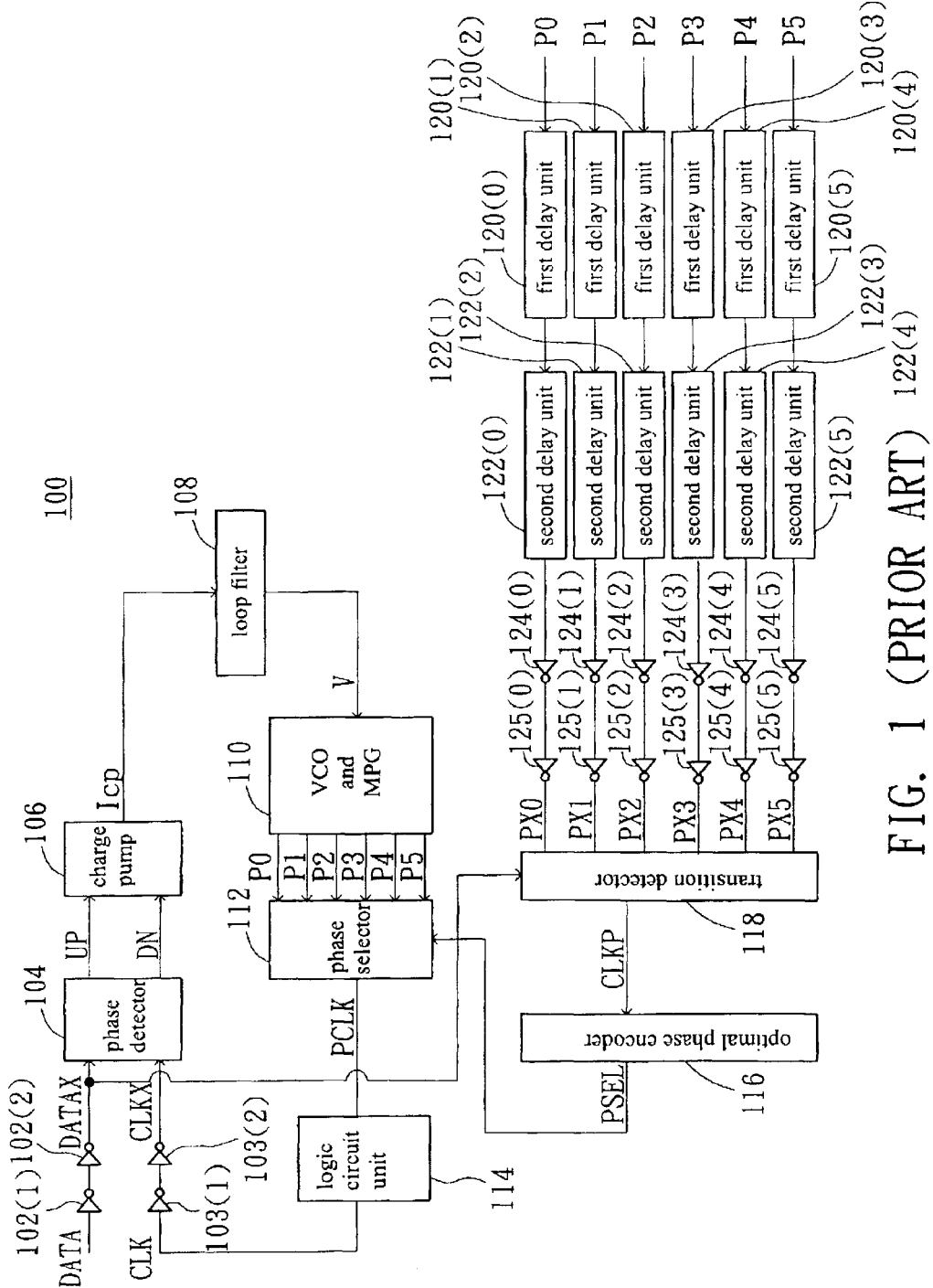
FIG. 1 illustrates the block diagram of a phase locked loop (PLL) according to a traditional method.

Unlike the traditional method illustrated in FIG. 1, the present invention simultaneously applies the data signal DATAX and the clock signal CLKX to a transition detector 218. The transition detector 218 outputs a data period value DATAP and a clock period value CLKP to an optimal phase encoder 216 by respectively comparing the data signal DATAX and the signal clock CLKX to the phase clock signal P0~P5. The optimal phase encoder 216 produces a phase select signal PSEL by calculating the data period value DATAP and the clock period value CLKP, which will be illustrated in FIG. 4.

Figure 3:
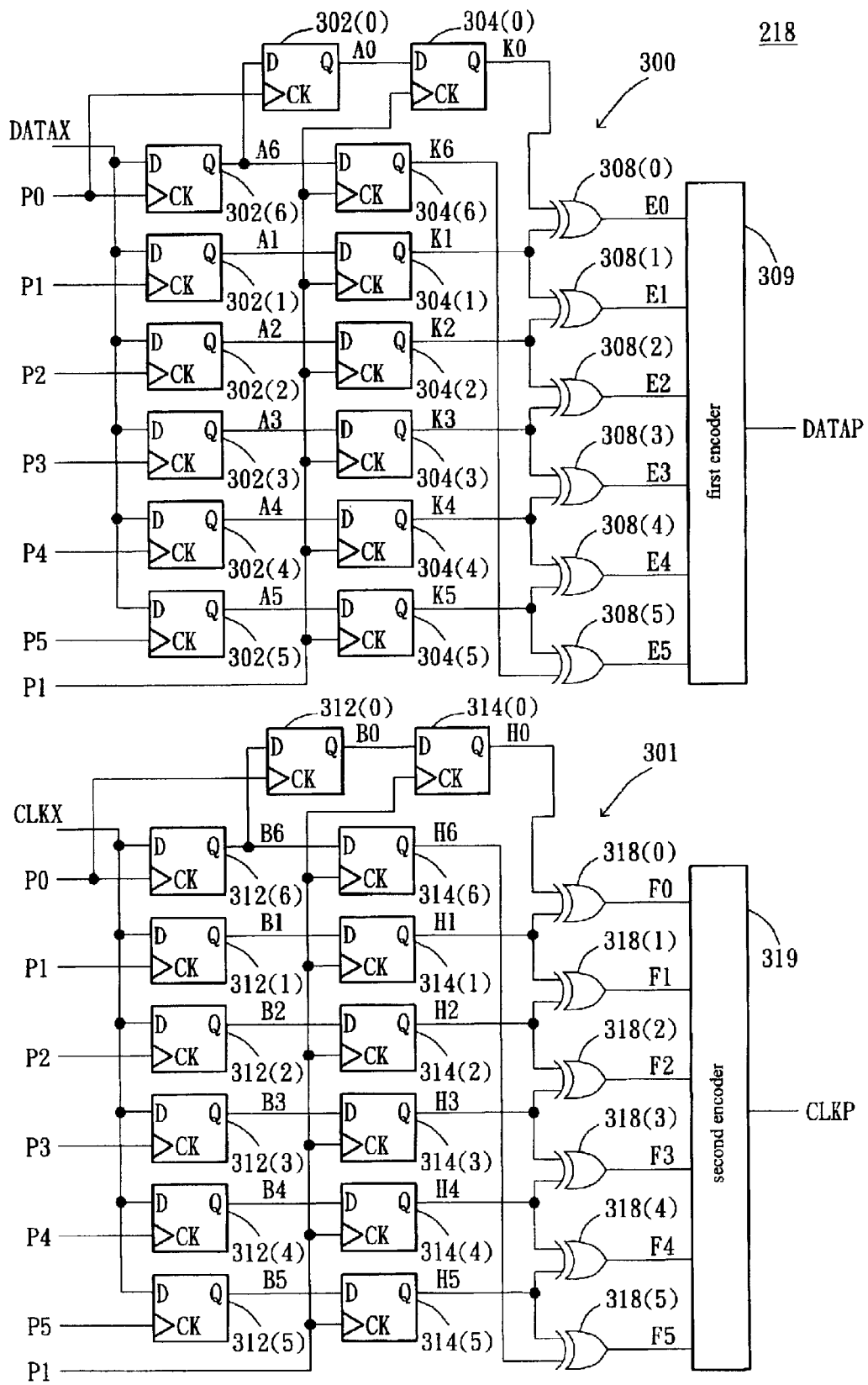
FIG. 3 illustrates the block diagram of the transition detector in FIG. 2.

FIG. 3 illustrates the block diagram of the transition detector 218 in FIG. 2. The transition detector 218 consists of a first transition detector 300 and a second transition detector 301, wherein the former one is used for receiving the data signal DATAX and the latter one is used for receiving the clock signal CLKX. Each of the first transition detector 300, 301 has fourteen D-type flip-flops, six exclusive-or-gates, and one encoder.

The data signal DATAX are respectively inputted to the input terminal D of the flip-flops 302(1)~302(6), and the phase clock signal P0~P5 are respectively inputted to the clock input terminal CK of the flip-flops 302(6), 302(1)~302 (5). The signals A1~A6 from the output terminal Q of the flip-flops 302(1)~302(6) are respectively inputted to the flip-flops 304(1)~304(6), and the signals K1~K6 are respectively produced from the output terminal Q of the flip-flops 304(1)~304(6) by the triggering of the phase clock signal P1. The signal A6 is further inputted to the flip-flop 302(0), and a signal A0 is produced from the output terminal Q of the flip-flops 302(0) by the triggering of the phase clock signal P0. Then, the signal A0 is inputted to the input terminal D of the flip-flops 304(0), and the signal K0 is produced from the output terminal Q of the flip-flops 304(0) by the triggering of the phase clock signal P1.

Then, signal K0 and K1 are inputted to the exclusive-or-gate 308(0), and a signal E0 is outputted there from. Likewise, signal E1 is outputted from the exclusive-or-gate 308(1) by inputting signal K1 and K2 thereto, and signal E5 is outputted from the exclusive-or-gate 308(5) by inputting signal K5 and K6 thereto. Finally, signals E0~E5 are inputted to a first encoder 309, and a data period value DATAP is produced there from.

Similarly, the clock signal CLKX are respectively inputted to the input terminal D of the flip-flops 312(1)~312(6), and the phase clock signal P0~P5 are respectively inputted to the clock input terminal CK of the flip-flops 312(6), 312(1)~312(5). The signals B1~B6 produced from the output terminal Q of the flip-flops 312(1)~312(6) are respectively inputted to the input terminal D of the flip-flops 314(1)~314(6), and the signals H1~H6 are respectively produced from the output terminal Q of the flip-flops 314(1)~314(6) by the triggering of the phase clock signal P1. The signal B6 is further inputted to the flip-flop 312(0), and a signal B0 is produced from the output terminal Q of the flip-flop 312(0) by the triggering of the phase clock signal P0. Then, the signal B0 is inputted to the input terminal D of the flip-flop 314(0), and the signal H0 is produced from the output terminal Q of the flip-flops 314(0) by the triggering of the phase clock signal P1.

Then, signals H0 and H1 are inputted to the exclusive-or-gate 318(0), and a signal F0 is outputted there from. Likewise, signal F1 is outputted from the exclusive-or-gate 318(1) by inputting signal H1 and H2 thereto, and signal F5 is outputted from the exclusive-or-gate 318(5) by inputting signal H5 and H6 thereto. Finally, signals F0~F5 are inputted to a second encoder 319, and a clock period value CLKP is produced.

Figure 4:
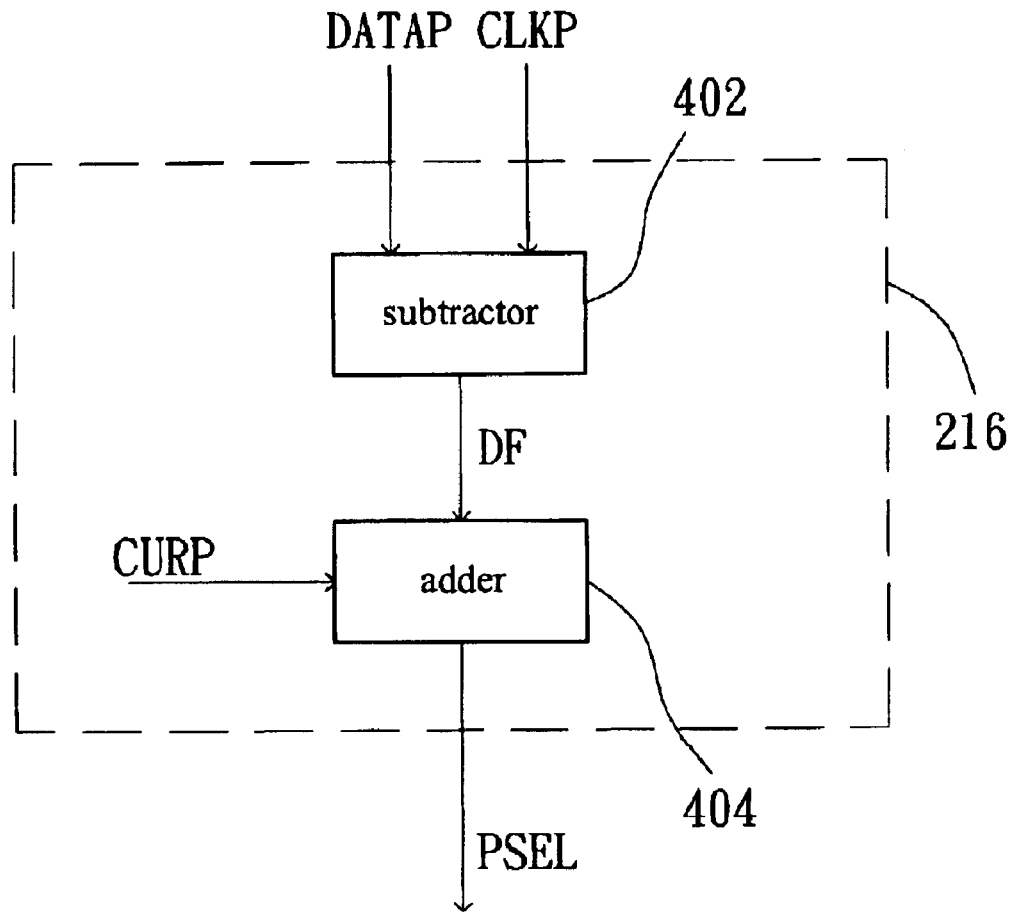
FIG. 4 illustrates the block diagram of the optimal phase encoder in FIG. 2

FIG. 4 illustrates the block diagram of the optimal phase encoder 216 in FIG. 2. The optimal phase encoder 216 consists of a subtractor 402 and an adder 404. The subtractor 402 receives the data period value DATAP and the clock period value CLKP, and outputs a signal DF by subtracting the clock period value CLKP from the data period value DATAP. The adder 404 receives the signal DF and outputs a phase select signal PSEL by adding the signal DF with the phase numeral CURP.

Figure 5:
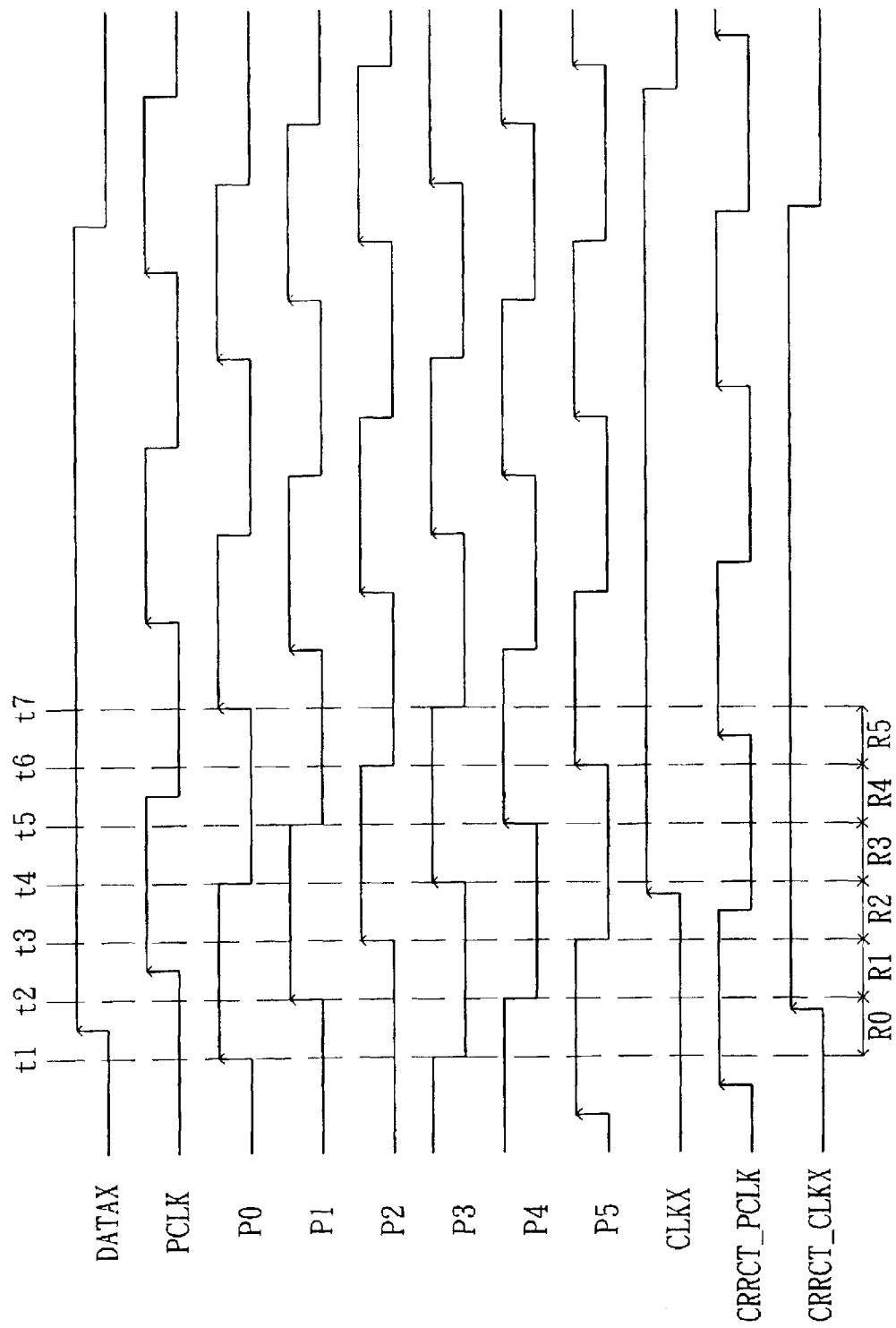
FIG. 5 illustrates the waveforms of the corresponding signals for the PLL in FIG. 2.

FIG. 5 illustrates the waveforms of the corresponding signals for the PLL 200 in FIG. 2. In this embodiment, the rising edge, which the signal transfers from low level to high level, is defined as the level transition. However, defining the falling edge as the level transition is also applicable in the present invention.

The level transitions of the phase clock signals P0~P5 respectively occur at t1 (or t7)~t6, and the period t1~t2, t2~t3, t3~t4, t4~t5, t5~t6, and t6~t7 are respectively defined as the transition regions R0, R1, R2, R3, R4, and R5. The transition regions R0, R1, R1, R2, R3, R4, and R5 respectively correspond to six region numerals 0, 1, 2, 3, 4, and 5. The data period value DATAP in FIGS. 2 to 4 is the region numeral of the transition region R when the data signal DATAX transits from the low level to high level. The clock period value CLKP in FIGS. 2 to 4 is the region numeral of the transition region R that the clock signal CLKX transits from the low level to high level.

An example is implemented in the following to further illustrate the present invention by referring FIGS. 2 to 5.

Initially, the phase clock signal P5, corresponding to the phase numeral CURP of 5, is supposed to be selected by the phase selector 212, and the basic clock signal PCLK having a level transition within transition region R1 is supposed to be outputted there from. After the processing of the logic circuit unit 214, the inverter 203(1), the clock signal CLKX produced from the inverter 203(2), is supposed to have a level transition in the transition region R2. Besides, the data signal DATAX is supposed to have a level transition in transition region R0. Then, the data signal DATAX and the clock signal CLKX are inputted into the transition detector 218 so as to determine the transition region R by respectively comparing with the phase clock signals P0~P5. The clock period value CLKP outputted from the second encoder 319 in FIG. 3 will be 2 since the signal F2 is logic high and the signals F0, F1, F3~F5 are logic low. Moreover, the data period value DATAP in FIG. 3 will be 0 since the signal E0 is logic high and signals E1~E5 are logic low.

After the clock period value CLKP of 2 and the data period value DATAP of 0 are outputted from the transition detector 218, they are inputted into the optimal phase encoder 216. In FIG. 4, by subtracting the clock period value CLKP of 2 from the data period value DATAP of 0, the signal DF outputted from the subtractor 402 will be −2. The numeral of −2 means that the data signal DATAX has a 2*60 degree phase prior to the clock signal CLKX. Therefore, the clock signal CLKX should be advanced by 2*60 degree.

Next, the adder 404 outputs a phase select signal PSEL of 3 to the phase selector 212 by adding the signal DF of −2 and the phase numeral of 5. The numeral of 3 indicates that the phase selector 212 changes its output from the phase clock signal P5 to phase clock signal P3 in order to advance the clock signal CLKX by 2*60 degree. Accordingly, as shown in FIG. 5, the phase selector 212 changes its output from the basic clock signal PCLK to the basic clock signal CRRCT_PCLK, and the inverter 203(2) changes its output from the clock signal CLKX to the clock signal CRRCT_CLKX. Please not that basic clock signal CRRCT_PCLK and the clock signal CRRCT_CLKX will have different quantity of phase changing respectively relative to the basic clock signal PCLK and the clock signal CLKX owing to the logic circuit unit 214. However, the phase of the clock signal CRRCT_CLKX of the transition region of R0 is certain to become advanced.

The clock signal CRRCT_CLKX has the level transition in the transition region of R0, as well as the data signal DATAX. Because that they have very little difference in phase, and the data signal DATAX succeeds in sampling, as well as the decoding of the data signal DATA.

In the present invention, by respectively detecting the transition regions R of the data signal DATAX and the clock signal CLKX, the signal DF shifts the phase of the basic clock signal PCLK so as to make the clock signal CLKX approach to the data signal DATAX in phase. Unlike conventional method that has to concern the delay time between clock signal CLKX and the basic clock signal PCLK, the present invention is applicable in any delay time between those. Thus, the present invention does not need to change the circuit structure as the delay time of the devices alters, and the circuit design is simplified. Moreover, the present invention does not apply the first delay unit 120 and the second delay unit 122 in FIG. 1, and can avoid the difference of the phase spacing. Therefore, particularly for the processing of high frequency, the present invention improves the operating speed and the operating resolution.

Figure 6:
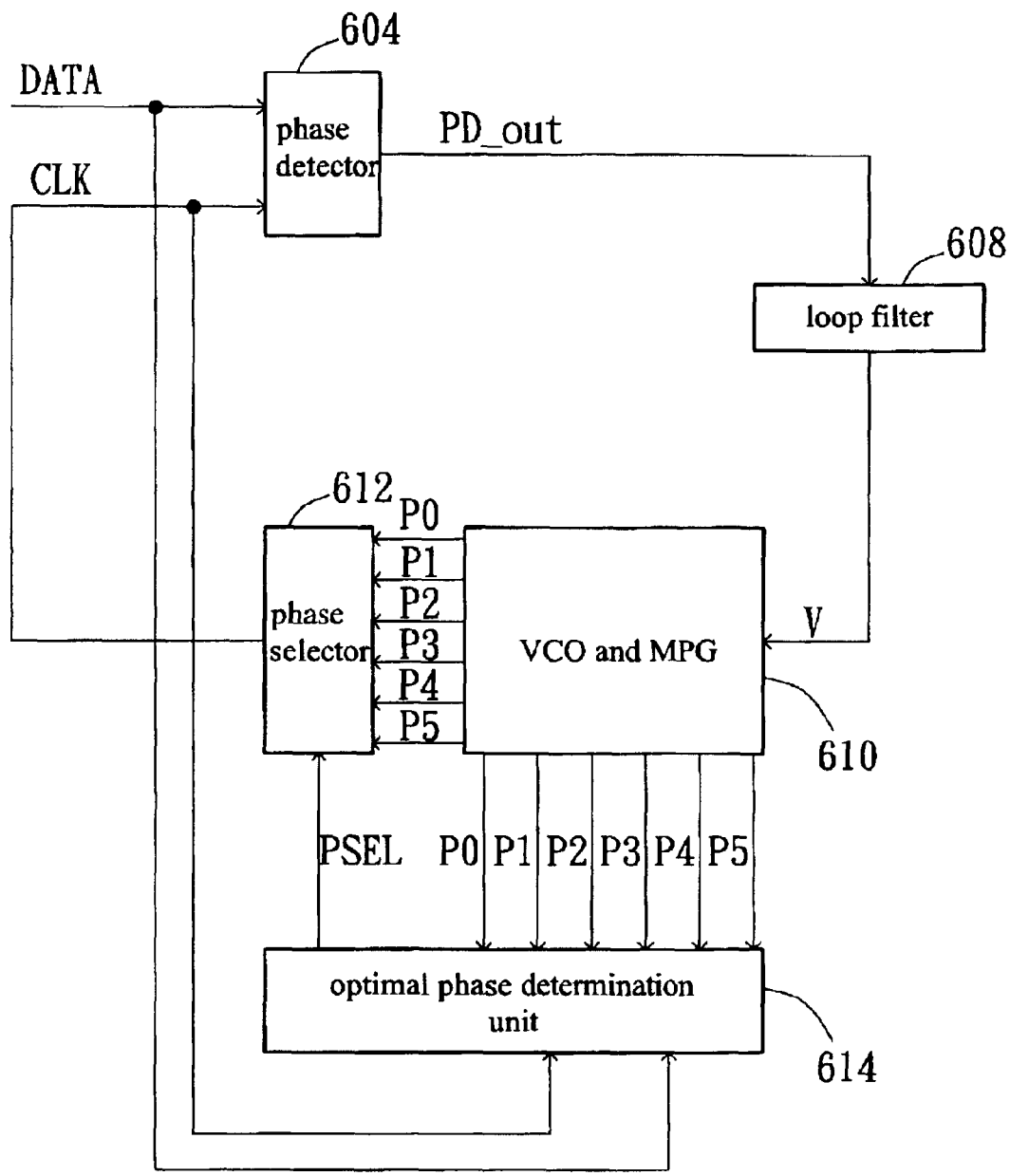
FIG. 6 illustrates the block diagram of a PLL according to the second embodiment of the present invention.

FIG. 6 illustrates the block diagram of a PLL according to the second embodiment of the present invention. Compared with the first embodiment in FIG. 2, the second embodiment uses an optimal phase determination unit 614 to replace the transition detector 218 and the optimal phase encoder 216, and does not use the inverters 202(1), 202(2), 203(1), 203(2), the logic circuit unit 214, and the charge pump 206.

Such that the optimal phase determination unit 614 receives the data signal DATA and the clock signal CLK, instead of the data signal DATAX and the clock signal CLKX, to determine the phase select signal PSEL. Unlike that the clock period value CLKP and the data period value DATAP is detected prior to the detection of the signal DF in the first embodiment, the optimal phase determination unit 614 in the second embodiment firstly detects the phase difference of the data signal DATA and the clock signal CLK, and then produces the signal DF corresponding to the phase difference. The optimal phase determination unit 614 outputs the phase select signal PSEL by adding the signal DF and the phase numeral CURP, too.

The phase detector 604 outputs a phase difference signal PD_out directly to the loop filter 608, instead of a rising signal UP and a descending signal DN to the charge pump 206 in FIG. 2. A voltage V produced from the loop filter 608 is inputted to the VCO and MPG 610, then phase clock signal P0~P5 are produced from the VCO and the MPG 610 and inputted to the optimal phase determination unit 614 in order to compared with the data signal DATA and the clock signal CLK.

Alternatively, the phase detector 604 also can output a phase difference signal PD_out directly to the optimal phase determination unit 614, and then the signal DF also can be produced there from. Moreover, the phase clock signals P are not limited to six, and the phase spacing is not limited to 60 degree, too. The number of the phase clock signals P is determined by the resolution requirement of the phase locked process.

From the above description, the present invention does not need to change the circuit structure as the delay time of the devices alters, and the circuit design is simplified. Moreover, the present invention can avoid the difference of the phase spacing, and the operating speed and the operating resolution are improved, particularly for the processing of high frequency.

While the invention has been described by way of example and in terms of the preferred embodiment, it is to be understood that the invention is not limited to the disclosed embodiment. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A phase locked loop (PLL) for receiving a data signal and generating a clock signal, said PLL comprising:
   a phase detector for receiving said data signal and said clock signal and for outputting a phase difference signal according to the phase difference between said data signal and said clock signal;
   a loop filter for outputting a voltage according to said phase difference signal;
   a voltage controlled oscillator (VCO) and multi-phase generator (MPG) for outputting N phase clock signals, wherein (i+1)th phase clock signal lags ith phase clock signal by a phase delay, and all of said N phase clock signals have same frequency corresponding to said voltage, said N and said i are integers and have a relationship of $0 \leq i < N-1$;
   a transition detector for outputting a data period value and a clock period value by receiving said N phase clock signals, said data signal and said clock signal, wherein the period between the level transition of ith phase clock signal and that of (i+1)th phase clock signal is defined as ith transition region, said data period value and said clock period value are respectively the numbers of said transition regions in which the level transitions of said data signal and said clock signal occur;
   an optimal phase encoder for outputting a phase select signal according to said data period value and said clock period value, wherein said phase select signal corresponds to the difference between said clock period value and said data period value; and
   a phase selector for outputting a jth phase clock signal according to said phase select signal, wherein said jth phase clock signal corresponds to said clock signal, and said j is an integer and obeys a relationship of $0 \leq j < N-1$.

2. A phase locked loop (PLL) for receiving a data signal and generating a clock signal, said PLL comprising:
   a phase detector for receiving said data signal and said clock signal and for outputting a phase difference signal according to the phase difference between said data signal and said clock signal;
   a loop filter for outputting a voltage according to said phase difference signal;
   a voltage controlled oscillator (VCO) and multi-phase generator (MPG) for outputting N phase clock signals, wherein (i+1)th phase clock signal lags ith phase clock signal by a phase delay, and all of said N phase clock signals have same frequency corresponding to said voltage, said N and said i are integers and have a relationship of $0 \leq i < N-1$;
   a transition detector for outputting a data period value and a clock period value by receiving said N phase clock signals, said data signal and said clock signal, wherein the period between the level transition of ith phase clock signal and that of (i+1)th phase clock signal is defined as ith transition region, said data period value and said clock period value are respectively the numbers of said transition regions in which the level transitions of said data signal and said clock signal occur;
   an optimal phase encoder for outputting a phase select signal according to said data period value and said clock period value, wherein said phase select signal corresponds to the difference between said clock period value and said data period value; and
   a phase selector for outputting a jth phase clock signal according to said phase select signal, wherein said jth phase clock signal corresponds to said clock signal, and said j is an integer and obeys a relationship of $0 \leq j < N-1$;
   wherein said optimal phase encoder includes:
     a subtractor for outputting a subtraction signal, wherein said subtraction signal is obtained by subtracting said clock period value from said data period value; and
     an adder for outputting said phase select signal by adding a phase number with said subtraction signal, wherein said phase number is the number of j of said phase clock signal produced from said phase selector.

3. The PLL according to claim 1, wherein said phase delay between said (i+1)th phase clock signal and said i phase clock signal is 360/N for $0 \leq i < N-1$.

4. The PLL according to claim 1 further comprising a charge pump for receiving said phase difference signal and outputting a charge current to said loop filter according to said phase difference signal, wherein said phase difference signal has a rising signal and a descending signal.

5. The PLL according to claim 1 further comprising a logic circuit unit for receiving said ith phase clock signal and outputting said clock signal.

6. A phase locked loop (PLL) for receiving a data signal and generating a clock signal, said PLL comprising:
- a phase detector for outputting a phase difference signal according to the phase difference between said data signal and said clock signal;
- a loop filter for outputting a voltage according to said phase difference signal;
- a voltage controlled oscillator (VCO) and multi-phase generator (MPG) for outputting N phase clock signals, wherein (i+1)th phase clock signal lags ith phase clock signal by phase delay, and all of said N phase clock signals have same frequency corresponding to said voltage, said N and said i are integers and have a relationship of $0 \leq i < N-1$;
- an optimal phase determination unit for outputting a phase select signal by receiving said N phase clock signals, said data signal, and said clock signal, wherein the phase difference between said data signal and said clock signal corresponds to m transition regions, the phase select signal is based on m, said m is an integer and obeys the relationship of $0 \leq m < N$; and
- a phase selector for outputting a jth phase clock signal according to said phase select signal, wherein said jth phase clock signal corresponds to said clock signal, and said j is an integer and obeys a relationship of $0 \leq j < N-1$.

7. A phase locked loop (PLL) for receiving a data signal and generating a clock signal, said PLL comprising:
- a phase detector for outputting a phase difference signal according to the phase difference between said data signal and said clock signal;
- a loop filter for outputting a voltage according to said phase difference signal;
- a voltage controlled oscillator (VCO) and multi-phase generator (MPG) for outputting N phase clock signals, wherein (i+1)th phase clock signal lags ith phase clock signal by phase delay, and all of said N phase clock signals have same frequency corresponding to said voltage, said N and said i are integers and have a relationship of $0 \leq i < N-1$;
- an optimal phase determination unit for outputting a phase select signal by receiving said N phase clock signals, said data signal, and said clock signal, wherein the phase difference between said data signal and said clock signal corresponds to m transition regions, said m is an integer and obeys the relationship of $0 \leq m < N$; and
- a phase selector for outputting a jth phase clock signal according to said phase select signal, wherein said jth phase clock signal corresponds to said clock signal, and said j is an integer and obeys a relationship of $0 \leq j < N-1$;
- wherein said optimal phase determination unit adds said m with a phase number, being the number of j for said phase clock signal outputted from said phase selector.

8. The PLL according to claim 6, wherein said phase delay between said (i+1)th phase clock signal and said i phase clock signal is 360/N for $0 \leq i < N-1$.

9. A phase locked loop (PLL) for receiving a data signal and generating a clock signal, said PLL comprising:
- a phase detector for receiving said data signal and said clock signal and for outputting a phase difference signal according to the phase difference between said data signal and said clock signal;
- a loop filter for outputting a voltage according to said phase difference signal;
- a voltage controlled oscillator (VCO) and multi-phase generator (MPG) for outputting N phase clock signals, wherein (i+1)th phase clock signal lags ith phase clock signal by a phase delay, and all of said N phase clock signals have same frequency corresponding to said voltage, said N and said i are integers and have a relationship of $0 \leq i < N-1$;
- a transition detector for outputting a data period value and a clock period value by receiving said N phase clock signals, said data signal and said clock signal, wherein the period between the level transition of ith phase clock signal and that of (i+1)th phase clock signal is defined as ith transition region, said data period value and said clock period value are respectively the numbers of said transition regions in which the level transitions of said data signal and said clock signal occur;
- an optimal phase encoder for outputting a phase select signal according to said data period value and said clock period value, wherein said phase select signal corresponds to the difference between said clock period value and said data period value; and
- a phase selector for outputting a jth phase clock signal according to said phase select signal, wherein said jth phase clock signal corresponds to said clock signal, and said j is an integer and obeys a relationship of $0 \leq j < N-1$;
- wherein said optimal phase encoder comprises:
  - a subtractor for outputting a subtraction signal, wherein said subtraction signal is obtained by subtracting said clock period value from said data period value; and
  - an adder for outputting said phase select signal by adding a phase number with said subtraction signal, wherein said phase number is the number of j of said phase clock signal produced from said phase selector.

10. A phase locked loop (PLL) for receiving a data signal and generating a clock signal, said PLL comprising:
- a phase detector for outputting a phase difference signal according to the phase difference between said data signal and said clock signal;
- a loop filter for outputting a voltage according to said phase difference signal;
- a voltage controlled oscillator (VCO) and multi-phase generator (MPG) for outputting N phase clock signals, wherein (i+1)th phase clock signal lags ith phase clock signal by phase delay, and all of said N phase clock signals have same frequency corresponding to said voltage, said N and said i are integers and have a relationship of $0 \leq i < N-1$;
- an optimal phase determination unit for outputting a phase select signal by receiving said N phase clock signals, said data signal, and said clock signal, wherein the phase difference between said data signal and said clock signal corresponds to m transition regions, said m is an integer and obeys the relationship of $0 \leq m < N$; and a phase selector for outputting a jth phase clock signal according to said phase select signal, wherein said jth phase clock signal corresponds to said clock signal, and said j is an integer and obeys a relationship of $0 \leq j < N-1$;

wherein said optimal phase determination unit adds said m with a phase number, being the number of j for said phase clock signal outputted from said phase selector.

* * * * *